United States Patent
Park

(10) Patent No.: US 8,325,514 B2
(45) Date of Patent: Dec. 4, 2012

(54) PHASE CHANGE MEMORY DEVICE

(75) Inventor: Kyoung-Wook Park, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 680 days.

(21) Appl. No.: 12/432,347

(22) Filed: Apr. 29, 2009

(65) Prior Publication Data
US 2010/0149861 A1 Jun. 17, 2010

(30) Foreign Application Priority Data
Dec. 12, 2008 (KR) .................. 10-2008-0126413

(51) Int. Cl.
*G11C 11/00* (2006.01)
(52) U.S. Cl. ... 365/163; 365/148; 365/226; 365/189.09; 365/189.06
(58) Field of Classification Search .................. 365/163, 365/148, 189.16, 226, 189.09
See application file for complete search history.

(56) References Cited

U.S. PATENT DOCUMENTS 8,081,501 B2 * 12/2011 Choi et al. .................. 365/148
2007/0217253 A1 * 9/2007 Kim et al. .................. 365/163
2007/0230239 A1 * 10/2007 Choi et al. .................. 365/163

FOREIGN PATENT DOCUMENTS
KR 1020070098457 10/2007

OTHER PUBLICATIONS
Notice of Preliminary Rejection issued from Korean Intellectual Property Office on May 31, 2010.

* cited by examiner

Primary Examiner — Vu Le
Assistant Examiner — Han Yang
(74) Attorney, Agent, or Firm — IP & T Group LLP

(57) ABSTRACT

A phase change memory device includes a plurality of programming current driving blocks each of which is configured to provide a corresponding phase change memory cell with a programming current corresponding to input data and a programming current adjusting block commonly connected to the plurality of programming current driving blocks and configured to generate a control voltage to adjust the programming current.

56 Claims, 5 Drawing Sheets

PHASE CHANGE MEMORY DEVICE

CROSS-REFERENCE TO RELATED APPLICATIONS

The present invention claims priority of Korean patent application number 10-2008-0126413, filed on Dec. 12, 2008, which is incorporated by reference in its entirety.

BACKGROUND OF THE INVENTION

The present invention relates to semiconductor design technology, and more particularly, to technology for controlling a set programming current and a reset programming current to program a phase change memory cell.

Although a dynamic random access memory (DRAM) device used as a main memory device of a computer can achieve random access and be highly integrated at low costs, it is volatile. A static random access memory (SRAM) device used as a cache memory device can achieve random access and operate faster than the DRAM device, but it is also volatile and has a disadvantage in an aspect of costs since its cell size is greater than that of the DRAM device. A NAND flash memory device, which is a non-volatile memory device, can be highly integrated at low costs and has an advantage in an aspect of power consumption, whereas it cannot achieve random access and has a low operating speed.

To overcome the disadvantages of the conventional memory devices, various memory devices are under development. Among them, a phase change random access memory (PCRAM) device has a non-volatile characteristic and can achieve random access and be highly integrated at low costs. The PCRAM device stores information using a phase change material. That is, the PCRAM device is a non-volatile memory device using a phase change of the phase change material according to a temperature requirement, i.e., the variation of a resistance value according to the phase change.

The phase change material includes a material that can be converted to an amorphous state or a crystalline state according to a temperature requirement. A representative phase change material is a chalcogenide alloy. The chalcogenide alloy includes $Ge_2Sb_2Te_5$ (GST) using germanium (Ge), antimony (Sb) and tellurium (Te). Therefore, the phase change material is generally written up as GST.

The PCRAM device generates a convertibly phase change between a crystalline state and an amorphous state of the GST using joule heating generated by the supply of current or voltage in a certain condition for the GST. The crystalline state is referred to as a set state and the GST in the set state has an electrical characteristic like a metal having a low resistance value. The amorphous state is referred to as a reset state and the GST in the reset state has a higher resistance value than in the set state. That is, the phase change memory device stores information using the variation of resistance values between in the crystalline state and in the amorphous state and the stored information is detected by sensing a current flowing through the GST or the voltage variation according to the current variation. In general, it is defined that the set state has a logic level '0' and the reset state has a logic level '1', and the GST maintains its state although the power is not supplied thereto.

The amorphous state and the crystalline state are convertible to each other according to a programming current. A set current is defined as a programming current for making a GST of a memory cell a set state and a reset current is defined as a programming current for making the GST of the memory cell a reset state. For the reference, the set current may be referred to as a set programming current and the reset current may be referred to as a reset programming current.

The GST is heated to a temperature higher than a melting point thereof for a certain time by the supply of the reset current and then is rapidly cooled down to be converted to the amorphous state. Furthermore, the GST is heated at a temperature that is higher than a crystallizing point and lower than the melting point for a given time and then is gradually cooled down to be converted to the crystalline state. Meanwhile, it is possible to construct a multi-level memory cell since the resistance value can be graded according to an amorphous volume or a crystalline volume of the GST. In general, the reset current provides a big current for a short time compared to the set current, whereas the set current provides a small current for a long time compared to the reset current. Namely, the state of the GST is changed by the joule heating of a certain condition generated by the supply of the programming current.

FIG. 1 provides a schematic diagram of a phase change memory cell.

Referring to FIG. 1, the phase change memory cell includes a phase change element GST connected between a bit line BL and a first node N0 and a cell transistor MN1 connected between the first node N0 and a ground voltage terminal VSS and controlled by a word line WL.

An operation of the phase change memory cell illustrated in FIG. 1 will be described hereafter.

An operation of programming data in the phase change element GST is performed as described below.

If the cell transistor MN1 is turned on as the word line WL is activated to a logic high level, a current path is generated between the ground voltage terminal VSS and the phase change element GST connected to the bit line BL. Therefore, by supplying the phase change element GST with a programming current corresponding to the data through the bit line BL, a state of the phase change element GST is converted to a crystalline state or an amorphous state. If the data has a logic level '1', a reset current is provided to the phase change element GST and thus the state of the phase change element GST is converted to a reset state. On the other hand, if the data has a logic level '0', a set current is supplied to the phase change element GST and thus the state of the phase change element GST is converted to a set state. The reset state that is the amorphous state has a greater resistance value than the set state that is the crystalline state.

Moreover, an operation of detecting data programmed in the phase change element GST is performed as follows.

If the cell transistor MN1 is turned on as the word line WL is activated to a logic high level, a current path is generated between the ground voltage terminal VSS and the phase change element GST connected to the bit line BL. Thus, when supplying the phase change element GST with a certain voltage or current through the bit line BL, an amount of current flowing through the phase change element GST changes or an amount of a voltage drop across the phase change element GST changes according to the resistance value of the phase change element GST and, therefore, it is possible to detect the data stored in the phase change element GST using the amount of current or voltage drop. That is, the state of the phase change element GST is detected.

FIG. 2 describes a schematic diagram of another phase change memory cell.

Referring to FIG. 2, the phase change memory cell includes a cell diode D1 having a cathode connected to a word line WL and an anode connected to a first node N0 and a phase change element GST connected between a bit line BL and the first node N0.

An operation of the phase change memory cell illustrated in FIG. 2 will be described hereafter.

An operation of programming data in the phase change element GST is performed as described below.

If the word line WL is activated to a logic low level, i.e., a ground voltage level, and a predetermined voltage is supplied through the bit line BL, the cell diode D1 becomes in a forward bias state and thus the cell diode D1 is turned on from when a voltage difference between the anode and the cathode of the cell diode D1 becomes greater than a threshold voltage. At this time, a current path is generated between the word line WL and the phase change element GST connected to the bit line BL. Therefore, by supplying the phase change element GST with a programming current corresponding to the data through the bit line BL, a state of the phase change element GST is converted to a crystalline state or an amorphous state. If the data has a logic level '1', a reset current is provided to the phase change element GST and thus the state of the phase change element GST is converted to a reset state. On the other hand, if the data has a logic level '0', a set current is supplied to the phase change element GST and thus the state of the phase change element GST is converted to a set state. The reset state that is the amorphous state has a greater resistance value than the set state that is the crystalline state.

Furthermore, an operation of detecting data programmed in the phase change element GST is performed as follows.

If the word line WL is activated to the logic low level, i.e., the ground voltage level, and a certain voltage is supplied through the bit line BL, the cell diode D1 becomes in a forward bias state and thus the cell diode D1 is turned on from when a voltage difference between the anode and the cathode of the cell diode D1 becomes greater than a threshold voltage. At this time, a current path is generated between the word line WL and the phase change element GST connected to the bit line BL. Thus, when supplying the phase change element GST with a certain voltage or current through the bit line BL, an amount of current flowing through the phase change element GST changes or an amount of the voltage drop across the phase change element GST changes according to the resistance value of the phase change element GST and, therefore, it is possible to detect the data stored in the phase change element GST using the amount of current or voltage drop. That is, the state of the phase change element GST is detected.

As described in FIG. 2, the structure of the phase change memory cell using the cell diode D1 instead of the cell transistor is advantageous on high integration since it has an excellent characteristic of providing a programming current and occupies a small area. Therefore, the phase change memory cell is recently constructed with rather the cell diode than the cell transistor.

FIG. 3 illustrates a schematic circuit diagram of a conventional phase change memory device.

Referring to FIG. 3, the conventional phase change memory device includes a programming current adjusting block 310 and a programming current driving block 320.

The programming current adjusting block 310 adjusts a voltage level of a control node N4 in response to an enable signal WDEN and first and second write control signals SETEN and RESETEN. In particular, the programming current adjusting block 310 adjusts the voltage level of the control node N4 in response to a code combination of write control codes STEP<0:5> that is periodically updated during an activation period of the first write control signal SETEN, whereas it adjusts the control node N4 to have a predetermined voltage level during an activation period of the second write control signal RESETEN.

The programming current driving block 320 provides a phase change memory cell with a programming current I_PRO corresponding to the voltage level of the control node N4 through a transmission line SIO.

Herein, the first write control signal SETEN and the second write control signal RESETEN are selectively enabled in response to input data that is to be programmed.

Furthermore, the conventional phase change memory device may include precharge blocks 330A and 330B for precharging the control node N4 and an output node N0 of the programming current I_PRO, respectively, in response to a precharge signal /PCG. Herein, the precharge blocks 330A and 330B include a PMOS transistor MP0 connected between a supply voltage terminal VPPYWD and the control node N4 and controlled by the precharge signal /PCG, an inverter INV for inverting the precharge signal /PCG and an NMOS transistor MN0 connected between the output node N0 of the programming current I_PRO and a ground voltage terminal VSS and controlled by an output signal of the inverter INV. Since the precharge signal /PCG is a signal pulsing for a given period after the activation periods of the first write control signal SETEN and the second write control signal RESETEN, it is enabled at a point where the supply of the programming current I_PRO is terminated to thereby raise a voltage level of the control node N4 to a supply voltage VPPYWD, so that a PMOS transistor MP8 is turned off and thus the current driving to the output node N0 is stopped. As a result, the output node N0 is precharged with a ground voltage VSS.

The programming current adjusting block 310 includes an NMOS transistor MN7 connected between the control node N4 and a first node N1 and controlled by the first write control signal SETEN, a variable resistance sector 311 connected between the first node N1 and a second node N2 and controlled by the write control codes STEP<0:5>, a PMOS transistor MP9 connected between the control node N4 and a third node N3 and controlled by the ground voltage VSS, an NMOS transistor MN8 connected between the third node N3 and the second node N2 and controlled by the second write control signal RESETEN, and an NMOS transistor MN9 connected between the second node N2 and the ground voltage terminal VSS and controlled by the enable signal WDEN. Herein, the variable resistance sector 311 includes a plurality of load transistor groups MP1•MN1, MP2•MN2, MP3•MN3, MP4•MN4, MP5•MN5, and MP6•MN6 that are connected in parallel with each other and controlled by the ground voltage VSS and the write control codes STEP<0:5>. The plurality of load transistor groups include PMOS transistors controlled by the ground voltage VSS and NMOS transistors each of which is connected to a corresponding PMOS transistor among the PMOS transistors and controlled by a corresponding one among the write control codes STEP<0:5>.

The programming current adjusting block 310 adjusts the voltage level of the control node N4 in response to the enable signal WDEN and the first and second write control signals SETEN and RESETEN. That is, the voltage level of the control node N4 is adjusted by determining the number of NMOS transistors that are turned on among the NMOS transistors MN1 to MN6 according to the code combination of the write control codes STEP<0:5>, wherein the code combination is periodically updated during the activation period of the first write control signal SETEN. Furthermore, the control node N4 is adjusted to a preset voltage level since the NMOS transistor MN8 is turned on during the activation period of the second write control signal RESETEN.

The programming current driving block 320 serves as a current mirror and thus includes a plurality of transistors, e.g., MP7 and MP8, to drive a current corresponding to the voltage level of the control node N4. That is, the programming current driving block 320 includes the PMOS transistor MP7 that is connected between the supply voltage terminal VPPYWD and the control node N4 and has a gate node connected to the control node N4, and the PMOS transistor MP8 that is connected between the supply voltage terminal VPPYWD and the output node N0 and has a gate node connected to the control node N4. The amount of the programming current I_PRO outputted from the programming current driving block 320 is determined by the voltage level of the control node N4 and the channel size of the transistors MP7 and MP8.

Meanwhile, as described above, the phase change memory device, including one programming current adjusting block for simultaneously controlling the set state and the reset state and the programming current driving block for providing the phase change memory cell with the programming current, has a lot of limitations to independently control the set state and the reset state and needs one programming current adjusting block to control one programming current driving block. Therefore, the conventional phase change memory device requires programming current adjusting blocks as many as programming current driving blocks, so that a whole circuit area of the phase change memory device increases.

SUMMARY OF THE INVENTION

Embodiments of the present invention are directed to providing a phase change memory device for independently controlling a set programming current and a reset programming current to reduce an area occupied by a programming current adjusting circuit.

In accordance with an aspect of the present invention, there is provided a phase change memory device, including a plurality of programming current driving blocks each of which is configured to provide a corresponding phase change memory cell with a programming current corresponding to input data, and a programming current adjusting block commonly connected to the plurality of programming current driving blocks and configured to generate a control voltage to adjust the programming current.

In accordance with another aspect of the present invention, there is provided a phase change memory device for providing a phase change memory cell with a programming current through the control of first and second control voltages corresponding to input data, the phase change memory device including a first common programming current adjusting sector including a first current driving unit for receiving a supply voltage and configured to provide a first operating current, thereby generating the first control voltage, a second common programming current adjusting sector including a second current driving unit for receiving the supply voltage and configured to provide a second operating current, thereby generating the second control voltage, a plurality of first programming current driving sectors each of which is configured to supply a corresponding phase change memory cell with a programming current corresponding to the first control voltage, and a plurality of second programming current driving sectors each of which is configured to supply the corresponding phase change memory cell with a programming current corresponding to the second control voltage.

In accordance with another aspect of the present invention, there is provided a phase change memory device including a plurality of phase change memory cell, a plurality of programming current driving blocks each of which is configured to provide a programming current corresponding to input data, a programming current adjusting block commonly connected to the plurality of programming current driving blocks and configured to generate a control voltage to adjust the programming current, and a plurality of transmission blocks each of which is coupled between a corresponding one of the programming current driving blocks and the corresponding phase change memory cell, and is configured to transmit the programming current to the corresponding phase change memory in response to a control signal.

In accordance with the present invention, it is possible to reduce the number of programming current adjusting blocks compared to the prior art by controlling a plurality of programming current driving blocks each of which provides a corresponding phase change memory cell with a programming current using one programming current adjusting block. As a result, a whole circuit area of the phase change memory device can be substantially reduced. Furthermore, since the phase change memory device employs a programming current adjusting block for adjusting a set programming current and a programming current adjusting block for adjusting a reset programming current separately and controls the two programming current adjusting blocks independently, it is possible to generate the set programming current and the reset programming current to be provided to a phase change memory cell in various manners and thus the programming performance of the phase change memory cell can be improved.

DESCRIPTION OF SPECIFIC EMBODIMENTS

Other objects and advantages of the present invention can be understood by the following description, and become apparent with reference to the embodiments of the present invention.

In general, a logic signal of a circuit is classified into a high logic level and a low logic level according to its voltage level and represented as '1' or '0'. Moreover, according to needs, the logic signal may have a high impedance (Hi-Z) state. In the embodiments of the present invention, a p-channel metal oxide semiconductor (PMOS) and an n-channel metal oxide semiconductor (NMOS) are kinds of a metal oxide semiconductor field-effect transistor (MOSFET), and each of a control voltage and a bias signal, a first control voltage and a first bias signal, and a second control voltage and a second bias signal are the same signals.

Figure 1:
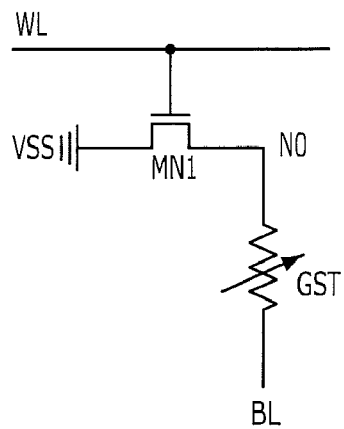
FIG. 1 illustrates a schematic diagram of a phase change memory cell.
Figure 2:
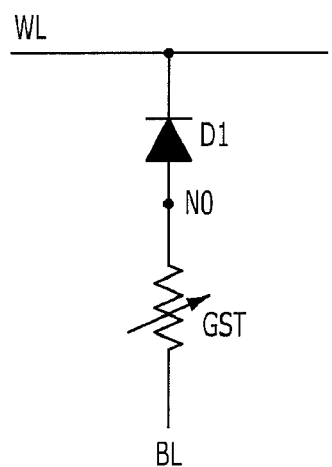
FIG. 2 illustrates a schematic diagram of another phase change memory cell.
Figure 3:
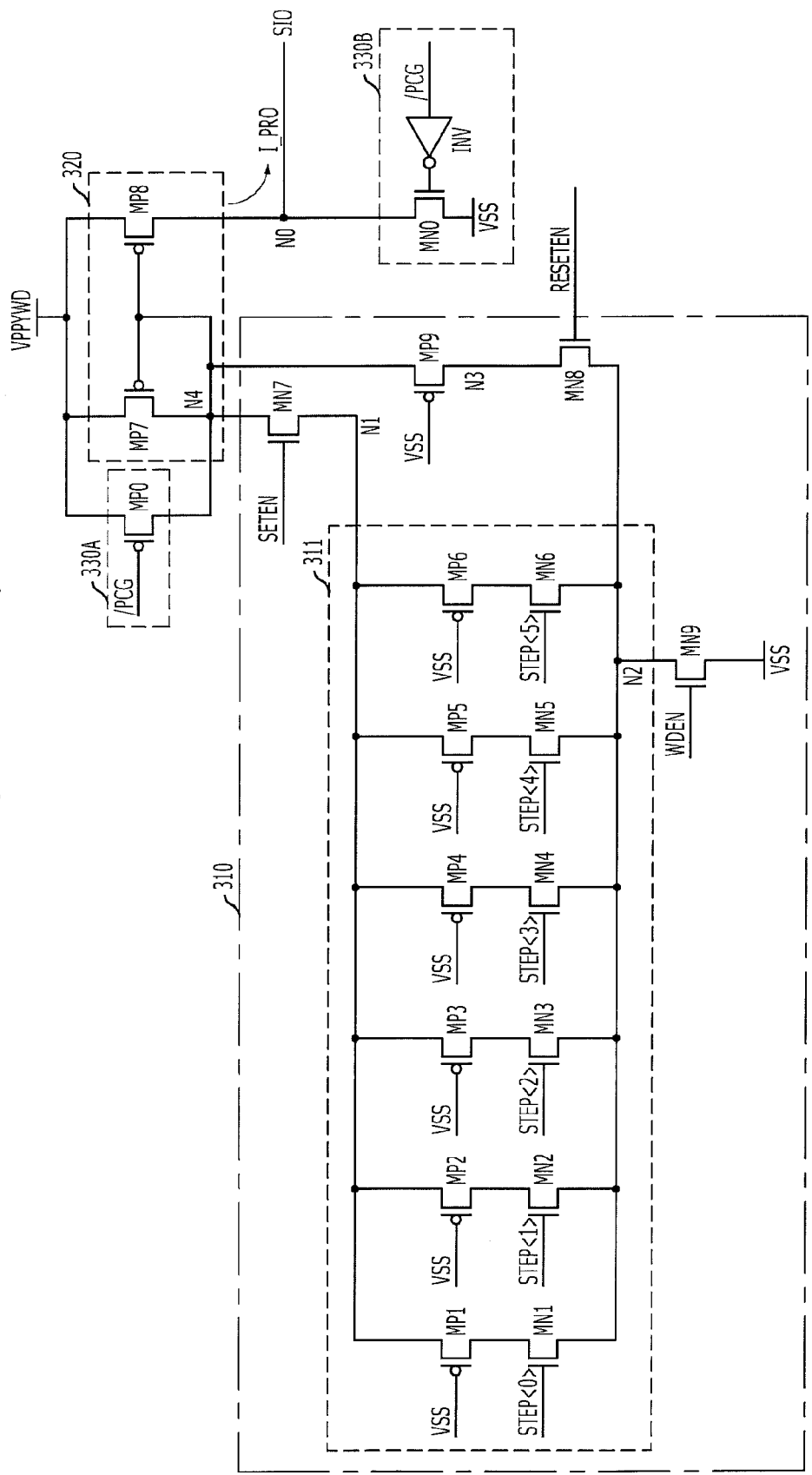
FIG. 3 illustrates a schematic circuit diagram of a conventional phase change memory device.
Figure 4:
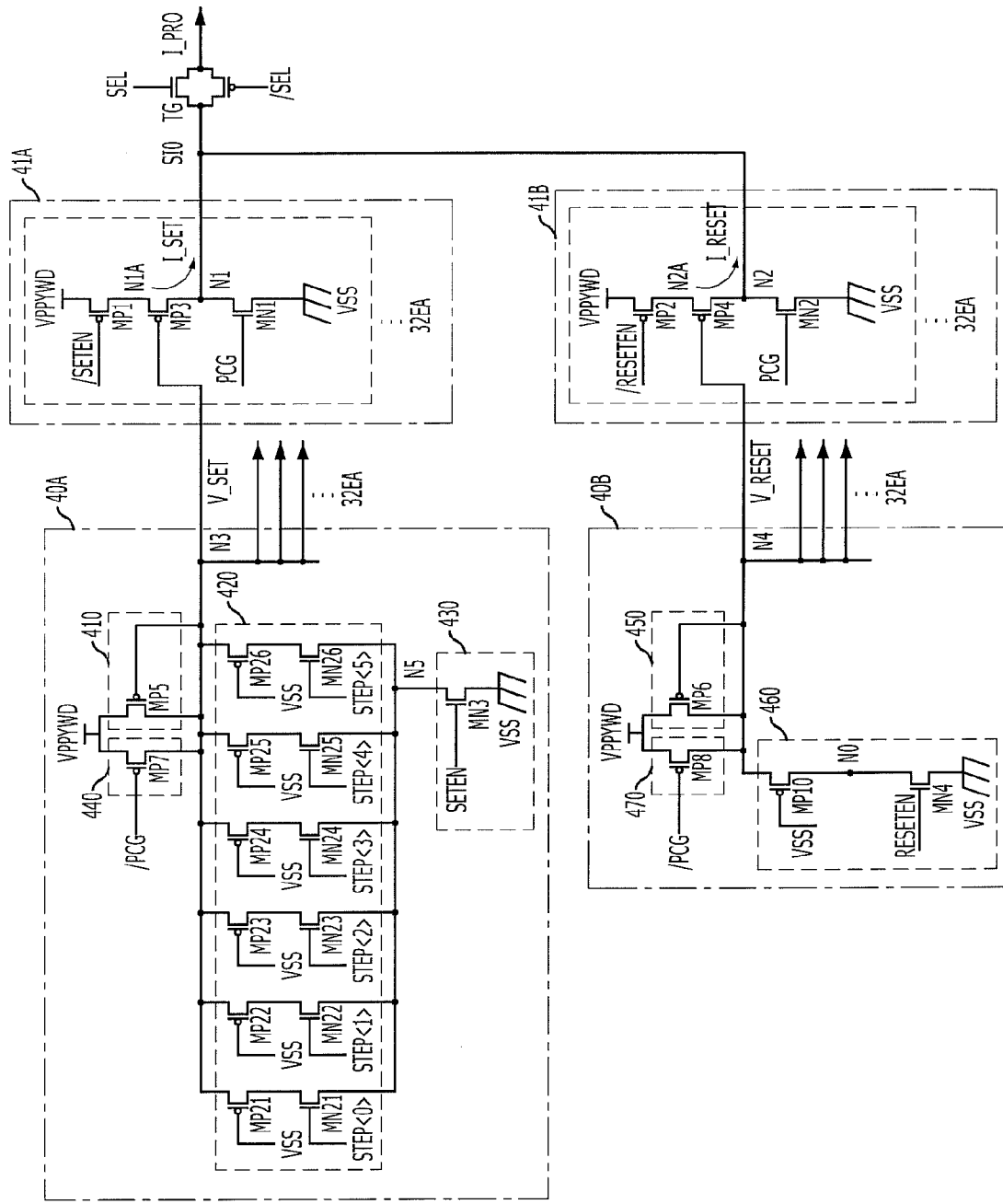
FIG. 4 illustrates a schematic circuit diagram of a phase change memory device in accordance with a first embodiment of the present invention.

FIG. 4 illustrates a schematic circuit diagram of a phase change memory device in accordance with a first embodiment of the present invention.

Referring to FIG. 4, the phase change memory device includes a plurality of programming current driving blocks 41A•41B and a programming current adjusting block 40A•40B commonly connected to the plurality of programming current driving blocks 41A•41B.

Each of the plurality of programming current driving blocks 41A•41B provides a corresponding phase change memory cell with a programming current I_PRO corresponding to input data. The programming current adjusting block 40A•40B generates control voltages V_SET and V_RESET to adjust the programming current I_PRO.

Herein, the plurality of programming current driving blocks 41A•41B consists of total 32 blocks and provides the corresponding phase change memory cells with the programming current I_PRO under the control of one programming current adjusting block 40A•40B. In this embodiment, the programming current I_PRO can be transmitted to a selected phase change memory cell through a transmission gate TG that is controlled by selection signals SEL and /SEL.

The programming current adjusting block 40A•40B adjusts voltage levels of the control voltages V_SET and V_RESET in response to the input data to be programmed. That is, the voltage levels of the first control voltage V_SET and the second control voltage V_RESET are adjusted to predetermined voltage levels according to a logic level of the input data. The plurality of programming current driving blocks 41A•41B outputs a set programming current I_SET or a reset programming current I_RESET as the programming current I_PRO, wherein the set programming current I_SET and the reset programming current I_RESET correspond to the voltage levels of the first control voltage V_SET and the second control voltage V_RESET, respectively.

The detailed construction and main operations of the phase change memory device described in FIG. 4 will be described hereafter.

The programming current adjusting block 40A•40B includes a first programming current adjusting sector 40A for outputting a first bias signal V_SET, i.e., the first control voltage V_SET, having a voltage level corresponding to write control codes STEP<0:5> in response to a first write control signal SETEN and a second programming current adjusting sector 40B for outputting a second bias signal V_RESET, i.e., the second control voltage V_RESET, having a predetermined voltage level in response to a second write control signal RESETEN. Herein, the first and second write control signals SETEN and RESETEN are generated in response to the input data to be programmed and the first write control signal SETEN or the second write control signal RESETEN is enabled according to the logic level of the input data.

The first programming current adjusting sector 40A includes a current driving unit 410 for providing an output node N3 with an operating current during an activation period of the first write control signal SETEN, a variable resistance unit 420 connected to the output node N3 and controlled by the write control codes STEP<0:5>, and a pull-down driving unit 430 connected to the variable resistance unit 420 and activated in response to the first write control signal SETEN.

As illustrated in this embodiment, the first programming current adjusting block 40A may further include a precharging unit 440 for precharging the output node N3 in response to a precharge signal /PCG. The precharging unit 440 includes a precharge PMOS transistor MP7 connected between a supply voltage terminal VPPYWD and the output node N3 and controlled by the precharge signal /PCG. Since the precharge signal /PCG is a signal pulsing for a certain period after the activation period of the first write control signal SETEN, it is enabled at a point where the supply of the set programming current I_SET is terminated to thereby precharge the output node N3 with a supply voltage VPPYWD.

The current driving unit 410 includes a PMOS transistor MP5 connected between the supply voltage terminal VPPYWD and the output node N3 and having a gate node connected to the output node N3, thereby providing the operating current. The variable resistance unit 420 includes a plurality of load transistor groups MP21•MN21, MP22•MN22, MP23•MN23, MP24•MN24, MP25•MN25, and MP26•MN26 that are connected in parallel with each other and controlled by the write control codes STEP<0:5> and a ground voltage VSS. Each of the plurality of load transistor groups includes a PMOS transistor controlled by the ground voltage VSS and an NMOS transistor that is connected to the PMOS transistor and controlled by a corresponding one among the write control codes STEP<0:5>. The pull-down driving unit 430 includes a pull-down NMOS transistor MN3 connected between the variable resistance unit 420 and a ground voltage terminal VSS and controlled by the first write control signal SETEN.

The first programming current adjusting sector 40A adjusts the voltage level of the output node N3 in response to the write control codes STEP<0:5> during the activation period of the first write control signal SETEN. The current driving unit 410 provides the operating current during the activation period of the first write control signal SETEN and the variable resistance unit 420 adjusts the voltage level of the output node N3 according to the number of NMOS transistors turned on among the plurality of NMOS transistors MN21 to MN26, wherein the number of NMOS transistors turned on is determined according to the code combination of the write control codes STEP<0:5> that is periodically updated during the activation period of the first write control signal SETEN. The pull-down driving unit 430 connected to the variable resistance unit 420 performs a pull-down operation during the activation period of the first write control signal SETEN to activate the current driving unit 410 and the variable resistance unit 420. An initial voltage level of the output node N3 is determined according to the current drivability of the current driving unit 410.

The second programming current adjusting sector 40B includes a current driving unit 450 for providing an operating current to an output node N4 during an activation period of the second write control signal RESETEN and a pull-down driving unit 460 connected to the output node N4 and activated in response to the second write control signal RESETEN.

As illustrated in this embodiment, the second programming current adjusting sector 40B may further include a precharging unit 470 for precharging the output node N4 in response to the precharge signal /PCG. Herein, the precharging unit 470 includes a precharge PMOS transistor MP8 connected between the supply voltage terminal VPPYWD and the output node N4 and controlled by the precharge signal /PCG. Since the precharge signal /PCG is a signal pulsing for a given period after the activation period of the second write control signal RESETEN, it is enabled at a point where the supply of the reset programming current I_RESET is terminated to thereby precharge the output node N4 with the supply voltage VPPYWD.

The current driving unit 450 includes a PMOS transistor MP6 that is connected between the supply voltage terminal VPPYWD and the output node N4 and has a gate node connected to the output node N4, thereby providing the operating current. The pull-down driving unit 460 includes a PMOS transistor MP10 and a pull-down NMOS transistor MN4 that are connected in series. The PMOS transistor MP10 is connected between the output node N4 and a first node N0 and controlled by the ground voltage VSS. The pull-down NMOS transistor MN4 is connected between the first node N0 and the ground voltage terminal VSS and controlled by the second write control signal RESETEN.

The second programming current adjusting sector 40B adjusts the output node N4 to have the predetermined voltage level during the activation period of the second write control signal RESETEN. The current driving unit 450 provides the operating current during the activation period of the second write control signal RESETEN and the pull-down driving unit 460 provided with the operating current performs the pull-down operation during the activation period of the second write control signal RESETEN to adjust the voltage level of the output node N4. The voltage level of the output node N4 is determined according to the current drivability of the current driving unit 450.

The plurality of programming current driving blocks 41A·41B includes a plurality of first programming current driving sectors 41A each of which provides a corresponding phase change memory cell with a set programming current I_SET corresponding to the first bias signal V_SET and a plurality of second programming current driving sectors 41B each of which provides a corresponding phase change memory cell with a reset programming current I_RESET corresponding to the second bias signal V_RESET.

Each of the plurality of first programming current driving sectors 41A includes a first PMOS transistor MP1, that is connected between the supply voltage terminal VPPYWD and a first node N1A and controlled by the first write control signal /SETEN, and a second PMOS transistor MP3, that is connected between the first node N1A and an output node N1 and controlled by the first bias signal V_SET, thereby outputting the set programming current I_SET corresponding to the voltage level of the first bias signal V_SET. As illustrated in this embodiment, the first programming current driving sector 41A may further include a precharge NMOS transistor MN1 connected between the output node N1 and the ground voltage terminal VSS and controlled by a precharge signal PCG. Since the precharge signal PCG is a signal pulsing for a predetermined period after the activation period of the first write control signal SETEN, it is enabled at a point where the supply of the set programming current I_SET is terminated to thereby precharge the output node N1 with the ground voltage VSS.

Furthermore, each of the plurality of second programming current driving sectors 41B includes a first PMOS transistor MP2 that is connected between the supply voltage terminal VPPYWD and a first node N2A and controlled by the second write control signal /RESETEN and a second PMOS transistor MP4 that is connected between the first node N2A and an output node N2 and controlled by the second bias signal V_RESET, thereby outputting the reset programming current I_RESET corresponding to the voltage level of the second bias signal V_RESET. As illustrated in this embodiment, the second programming current driving sector 41B may further include a precharge NMOS transistor MN2 connected between the output node N2 and the ground voltage terminal VSS and controlled by the precharge signal PCG. Since the precharge signal PCG is a signal pulsing for a predetermined period after the activation period of the second write control signal RESETEN, it is enabled at a point where the supply of the reset programming current I_RESET is terminated to thereby precharge the output node N2 with the ground voltage VSS.

Hereafter, the present invention illustrated in FIG. 4 will be described in another aspect.

For the reference, since the first embodiment of the present invention illustrated in FIG. 4 was already described above in detail, the construction and main operations required to definitely explain another aspect of the present invention will be only described hereafter and the above described and overlapping explanation will be omitted.

Referring to FIG. 4, the phase change memory device, which provides phase change memory cells with the programming current I_PRO under the control of the first and second control voltages V_SET and V_RESET corresponding to the input data, includes the first common programming current adjusting sector 40A containing the first current driving unit 410 for receiving the supply voltage VPPYWD and providing the operating current to generate the first control voltage V_SET, the second common programming current adjusting sector 40B containing the second current driving unit 450 for receiving the supply voltage VPPYWD and providing the operating current to generate the second control voltage V_RESET, the plurality of first programming current driving sectors 41A each of which supplies a corresponding phase change memory cell with the set programming current I_SET corresponding to the first control voltage V_SET and the plurality of second programming current driving sectors 41B each of which supplies a corresponding phase change memory cell with the reset programming current I_RESET corresponding to the second control voltage V_RESET.

The detailed construction and main operations of the phase change memory device having the above configuration will be described hereafter.

The first common programming current adjusting sector 40A includes the first current driving unit 410 for providing the output node N3 of the first control voltage V_SET with the operating current during the activation period of the first write control signal SETEN, the variable resistance unit 420 connected to the output node N3 of the first control voltage V_SET and controlled by the write control codes STEP<0:5>, and the pull-down driving unit 430 connected to the variable resistance unit 420 and activated in response to the first write control signal SETEN.

Furthermore, the second common programming current adjusting sector 40B includes the second current driving unit 450 for providing the output node N4 of the second control voltage V_RESET with the operating current during the activation period of the second write control signal RESETEN and the pull-down driving unit 460 connected to the output node N4 of the second control voltage V_RESET and activated in response to the second write control signal RESETEN.

Herein, the first and second write control signals SETEN and RESETEN are generated in response to the input data to be programmed, and the first write control signal SETEN or the second write control signal RESETEN is enabled according to the logic level of the input data.

The plurality of first programming current driving sectors 41A consists of total 32 sectors and provides corresponding memory cells with the set programming current I_SET under the control of the first common programming current adjusting sector 40A. Meanwhile, the plurality of second programming current driving sectors 41B consists of total 32 sectors and provides the corresponding memory cells with the reset programming current I_RESET under the control of the second common programming current adjusting sector 40B. In accordance with this embodiment, the programming current I_PRO can be transmitted to a selected phase change memory cell through a transmission gate TG controlled by the selection signals SEL and /SEL.

The first and second programming current adjusting sectors 40A and 40B adjust the voltage levels of the first control voltage V_SET and the second control voltage V_RESET in response to the input data to be programmed. That is, the voltage levels of the first control voltage V_SET and the second control voltage V_RESET are adjusted to predetermined voltage levels according to the logic level of the input data. The plurality of first and second programming current driving sectors 41A and 41B outputs the set programming current I_SET or the reset programming current I_RESET as the programming current I_PRO, wherein the set programming current I_SET and the reset programming current I_RESET correspond to the first control voltage V_SET and the second control voltage V_RESET, respectively.

In the meantime, the first programming current adjusting sector 40A for controlling the set programming current I_SET and the second programming current adjusting sector 40B for controlling the reset programming current I_RESET operate by receiving the operating current from the current driving units 410 and 450, respectively. Since the current driving unit 410 of the first programming current adjusting sector 40A and the current driving unit 450 of the second programming current adjusting sector 40B may be independently designed from each other to control their current drivability, the set programming current I_SET and the reset programming current I_RESET can be independently controlled from each other. Namely, the set programming current I_SET and the reset programming current I_RESET for programming the phase change memory cell may be supplied through various methods and, as a result, it is possible to improve the programming characteristic of the phase memory cell.

Figure 5:
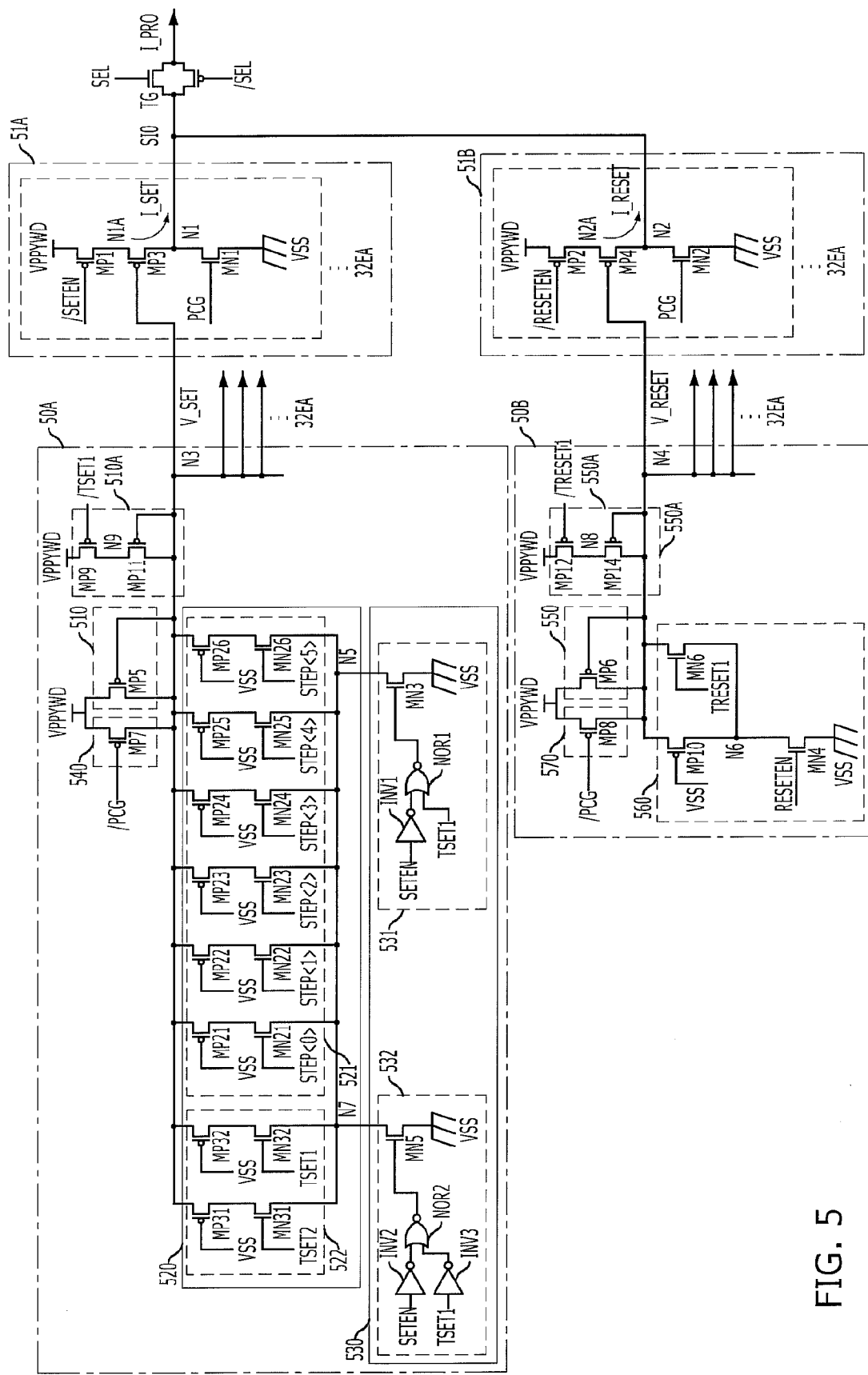
FIG. 5 illustrates a schematic circuit diagram of a phase change memory device in accordance with a second embodiment of the present invention.

FIG. 5 illustrates a schematic circuit diagram of a phase change memory device in accordance with a second embodiment of the present invention.

Referring to FIG. 5, the phase change memory device includes a plurality of programming current driving blocks 51A•51B, each of which provides a corresponding phase change memory cell with a programming current I_PRO corresponding to input data, and a programming current adjusting block 50A•50B, that is commonly connected to the plurality of programming current driving blocks 51A•51B, and generates control voltages V_SET and V_RESET to adjust the programming current I_PRO.

The plurality of programming current driving blocks 51A•51B consists of total 32 blocks and provides the corresponding phase change memory cells with the programming current I_PRO under the control of one programming current adjusting block 50A•50B. In accordance with this embodiment, the programming current I_PRO may be transmitted to a selected phase change memory cell through a transmission gate TG controlled by selection signals SEL and /SEL.

The programming current adjusting block 50A•50B adjusts voltage levels of the control voltages V_SET and V_RESET corresponding to the input data to be programmed. The voltage levels of the first control voltage V_SET and the second control voltage V_RESET are adjusted to predetermined voltage levels according to the input data. The plurality of programming current driving blocks 51A•51B outputs a set programming current I_SET or a reset programming current I_RESET as the programming current I_PRO, wherein the set programming current I_SET and the reset programming current I_RESET correspond to the voltage levels of the first control voltage V_SET and the second control voltage V_RESET, respectively.

A detailed construction and main operations of the phase change memory device illustrated in FIG. 5 will be described hereafter.

The programming current adjusting block 50A•50B includes a first programming current adjusting sector 50A and a second programming current adjusting sector 50B. The first programming current adjusting sector 50A is supplied with a first operating current in response to a first write control signal SETEN and further a second operating current in response to a first control signal /TSET1, thereby outputting a first bias signal V_SET, i.e., the first control voltage V_SET, having a voltage level corresponding to write control codes STEP<0:5>, TSET1 and TSET2. The second programming current adjusting sector 50B is supplied with a third operating current in response to a second write control signal RESETEN and further a fourth operating current in response to a second control signal /TRESET1, thereby outputting a second bias signal V_RESET, i.e., the second control voltage V_RESET, having a predetermined voltage level.

Herein, the first and second write control signals SETEN and RESETEN are generated in response to the input data to be programmed, and the first write control signal SETEN or the second write control signal RESETEN is enabled according to a logic level of the input data. Meanwhile, the first and second control signals /TSET1 and /TRESET1 are generated in a test mode and controlled to additionally provide an operating current.

The first programming current adjusting sector 50A includes a first current driving unit 510 for providing the first operating current to an output node N3 during an activation period of the first write control signal SETEN, a second current driving unit 510A for providing the second operating current to the output node N3 in response to the first control signal /TSET1 during the activation period of the first write control signal SETEN, a variable resistance unit 520 connected to the output node N3 and controlled by the write control codes STEP<0:5>, and a pull-down driving unit 530 connected to the variable resistance unit 520 and activated in response to the first write control signal SETEN and the first control signal TSET1.

In accordance with this embodiment, the first programming current adjusting sector 50A may further include a precharging unit 540 for precharging the output node N3 in response to a precharge signal /PCG. The precharging unit 540 includes a precharge PMOS transistor MP7 connected between a supply voltage terminal VPPYWD and the output node N3 and controlled by the precharge signal /PCG. Since the precharge signal /PCG is a signal pulsing for a certain period after the activation period of the first write control signal SETEN, it is enabled at a point where the supply of the set programming current I_SET is terminated to thereby precharge the output node N3 with a supply voltage VPPYWD.

The first current driving unit 510 includes a first PMOS transistor MP5 that is connected between the supply voltage terminal VPPYWD and the output node N3 and has a gate node connected to the output node N3, thereby providing the first operating current.

The second current driving unit 510A includes a second PMOS transistor MP9 connected between the supply voltage terminal VPPYWD and a first node N9 and controlled by the first control signal /TSET1 and a third PMOS transistor MP11 connected between the first node N9 and the output node N3 and having a gate node connected to the output node N3, thereby providing an additional operating current, i.e., the second operating current.

The variable resistance unit 520 includes a plurality of first transistor groups 521, i.e., MP21•MN21, MP22•MN22, MP23•MN23, MP24•MN24, MP25•MN25, and MP26•MN26 that are connected in parallel with each other and controlled by the first write control codes STEP<0:5> and a ground voltage VSS, and a plurality of second transistor groups 522, i.e., MP31•MN31 and MP32•MN32 that are connected in parallel with each other and controlled by the second write control codes TSET1 and TSET2 and the ground voltage VSS. Herein, the second write control codes TSET1 and TSET2 are generated in the test mode. A part of the second write control codes may use the first control signal TSET1 or generate and use a signal having a certain pulse width and shape in the test mode.

Each of the plurality of first transistor groups 521 includes a PMOS transistor controlled by the ground voltage VSS and an NMOS transistor that is connected to the PMOS transistor and controlled by a corresponding one among the first write control codes STEP<0:5>. Furthermore, each of the plurality of second transistor groups 522 includes a PMOS transistor controlled by the ground voltage VSS and an NMOS transistor that is connected to the PMOS transistor and controlled by a corresponding one of the second write control codes TSET1 and TSET2.

The pull-down driving unit 530 includes a plurality of transistors connected between the variable resistance unit 520 and the ground voltage terminal VSS and responding to the first write control signal SETEN and the first control signal TSET1. That is, the pull-down driving unit 530 includes a first inverter INV1 for receiving the first write control signal SETEN, a first logic gate NOR1 for receiving an output signal of the first inverter INV1 and the first control signal TSET1, a first pull-down NMOS transistor MN3 connected between the plurality of first transistor groups 521 and the ground voltage terminal VSS and controlled by an output signal of the first logic gate NOR1, a second inverter INV2 for receiving the first write control signal SETEN, a third inverter INV3 for receiving the first control signal TSET1, a second logic gate NOR2 for receiving output signals of the second and the third inverters INV2 and INV3, and a second pull-down NMOS transistor MN5 connected between the plurality of second transistor groups 522 and the ground voltage terminal VSS and controlled by an output signal of the second logic gate NOR2.

The first programming current adjusting sector 50A adjusts the voltage level of the output node N3 in response to the write control codes STEP<0:5>, TSET1 and TSET2 during the activation period of the first write control signal SETEN. The first current driving unit 510 provides the first operating current during the activation period of the first write control signal SETEN and the plurality of first transistor groups 521 of the variable resistance unit 520 provided with the first operating current adjusts the voltage level of the output node N3 according to the number of NMOS transistors turned on among the plurality of NMOS transistors MN21 to MN26, wherein the number of NMOS transistors turned on is determined according to the code combination of the first write control codes STEP<0:5> that is periodically updated during the activation period of the first write control signal SETEN.

The second current driving unit 510A additionally provides the second operating current in response to the first control signal /TSET1 during the activation period of the first write control signal SETEN.

The plurality of second transistor groups 522 of the variable resistance unit 520 provided with the second operating current adjusts the voltage level of the output node N3 according to the number of NMOS transistors turned on among the plurality of NMOS transistors MN31 and MN32, wherein the number of NMOS transistors turned on is determined according to the control of the second write control codes TSET1 and TSET2 pulsing during the activation period of the first write control signal SETEN.

As described above, in a normal operation mode, the first programming current adjusting sector 50A adjusts the voltage level of the output node N3 using the activated first current driving unit 510, the activated plurality of first transistor groups 521 of the variable resistance unit 520 and a activated first pull-down driving unit 531. Meanwhile, since the first control signals TSET1 and /TSET1 and the second write control codes TSET1 and TSET2 are generated in the test mode, the first and second current driving units 510 and 510A, the plurality of second transistor group 522 of the variable resistance unit 520 and a second pull-down driving unit 532 are activated in the test mode to adjust the voltage level of the output node N3. That is, in the test mode, it is possible to adjust an initial absolute value of the set programming current I_SET by providing an additional operating current. Furthermore, it is possible to generate the set programming current I_SET having a square wave through the control of the second write control codes TSET1 and TSET2.

The second programming current adjusting sector 50B includes a first current driving unit 550 for providing an output node N4 with the third operating current during an activation period of the second write control signal RESETEN, a second current driving unit 550A for providing the output node N4 with the fourth operating current in response to the second control signal /TRESET1 during the activation period of the second write control signal RESETEN, and a pull-down driving unit 560 connected to the output node N4 and activated in response to the second write control signal RESETEN and the second control signal TRESET1.

In this embodiment, the second programming current adjusting sector 50B may further include a precharging unit 570 for precharging the output node N4 in response to the precharge signal /PCG. The precharging unit 570 includes a precharge PMOS transistor MP8 that is connected between the supply voltage terminal VPPYWD and the output node N4 and controlled by the precharge signal /PCG. Since the precharge signal /PCG is a signal pulsing for a given period after the activation period of the second write control signal RESETEN, it is enabled at a point where the supply of the reset programming current I_RESET is terminated to thereby precharge the output node N4 with the supply voltage VPPYWD.

Herein, the first current driving unit 550 includes a first PMOS transistor MP6 that is connected between the supply voltage terminal VPPYWD and the output node N4 and has a gate node connected to the output node N4, thereby providing the first operating current.

The second current driving unit 550A includes a second PMOS transistor MP12 connected between the supply voltage terminal VPPYWD and a first node N8 and controlled by the second control signal /TRESET1 and a third PMOS transistor MP14 connected between the first node N8 and the output node N4 and having a gate node connected to the output node N4, thereby providing an additional operating current, i.e., the fourth operating current.

The pull-down driving unit 560 includes a plurality of transistors connected between the output node N4 and the ground voltage terminal VSS and responding to the second write control signal RESETEN and the second control signal TRESET1. Namely, the pull-down driving unit 560 includes a PMOS transistor MP10 connected between the output node N4 and a first node N6 and controlled by the ground voltage VSS, an NMOS transistor MN6 connected between the output node N4 and the first node N6 and controlled by the second control signal TRESET1, and a pull-down NMOS transistor MN4 connected between the first node N6 and the ground voltage terminal VSS and controlled by the second write control signal RESETEN.

The second programming current adjusting sector 50B adjusts a voltage level of the output node N4 to a predetermined voltage level during the activation period of the second write control signal RESETEN. The first current driving unit 550 provides the third operating current during the activation period of the second write control signal RESETEN and the pull-down driving unit 560 supplied with the third operation current adjusts the voltage level of the output node N4 by performing the pull-down operation during the activation period of the second write control signal RESETEN.

In the meantime, the second current driving unit 550A additionally provides the fourth operating current in response to the second control signal /TRESET1 during the activation period of the second write control signal RESETEN. The pull-down driving unit 560 provided with the third and the fourth operating currents performs the pull-down operation in response to the second control signal TRESET1 pulsing during the activation period of the second write control signal RESETEN, thereby adjusting the voltage level of the output node N4.

As depicted above, the second programming current adjusting sector 50B adjusts the voltage level of the output node N4 using the activated first current driving unit 550 and the activated PMOS transistor MP10 of the pull-down driving unit 560 in the normal operation mode. Furthermore, since the second control signals TRESET1 and /TRESET1 are generated in the test mode, the first and second current driving units 550 and 550A and the PMOS transistor MP10 and the NMOS transistor MN6 of the pull-down driving unit 560 are activated to adjust the voltage level of the output node N4 in the test mode. That is, it is possible to adjust an initial absolute value of the reset programming current I_RESET by additionally providing the fourth operating current in the test mode. Moreover, it is possible to control a shape of the reset programming current I_RESET through the control of the second control signals TRESET1 and /TRESET1.

The programming current driving blocks 51A•51B include a plurality of first programming current driving sectors 51A, each of which supplies a corresponding phase change memory cell with the set programming current I_SET corresponding to the voltage level of the first bias signal V_SET, and a plurality of second programming current driving sectors 51B each of which provides the corresponding phase change memory cell with the reset programming current I_RESET corresponding to the voltage level of the second bias signal V_RESET.

Herein, each of the plurality of first programming current driving sectors 51A includes a first PMOS transistor MP1 connected between the supply voltage terminal VPPYWD and a first node N1A and controlled by the first write control signal /SETEN and a second PMOS transistor MP3 connected between the first node N1A and an output node N1 and controlled by the first bias signal V_SET, thereby outputting the set programming current I_SET corresponding to the voltage level of the first bias signal V_SET. As described in this embodiment, the first programming current driving sector 51A may further include a precharge NMOS transistor MN1 connected between the output node N1 and the ground voltage terminal VSS and controlled by the precharge signal PCG. Since the precharge signal PCG is a signal pulsing for a predetermined period after the activation period of the first write control signal SETEN, it is enabled at a point where the supply of the set programming current I_SET is terminated to thereby precharge the output node N1 with the ground voltage VSS.

Each of the plurality of second programming current driving sectors 51B includes a first PMOS transistor MP2 connected between the supply voltage terminal VPPYWD and a first node N2A and controlled by the second write control signal /RESETEN and a second PMOS transistor MP4 connected between the first node N2A and an output node N2 and controlled by the second bias signal V_RESET, thereby outputting the reset programming current I_RESET corresponding to the voltage level of the second bias signal V_RESET. As described in this embodiment, the second programming current driving sector 51B may further include a precharge NMOS transistor MN2 connected between the output node N2 and the ground voltage terminal VSS and controlled by the precharge signal PCG. Since the precharge signal PCG is a signal pulsing for a predetermined period after the activation period of the second write control signal RESETEN, it is enabled at a point where the supply of the reset programming current I_RESET is terminated to thereby precharge the output node N2 with the ground voltage VSS.

Figure 6:
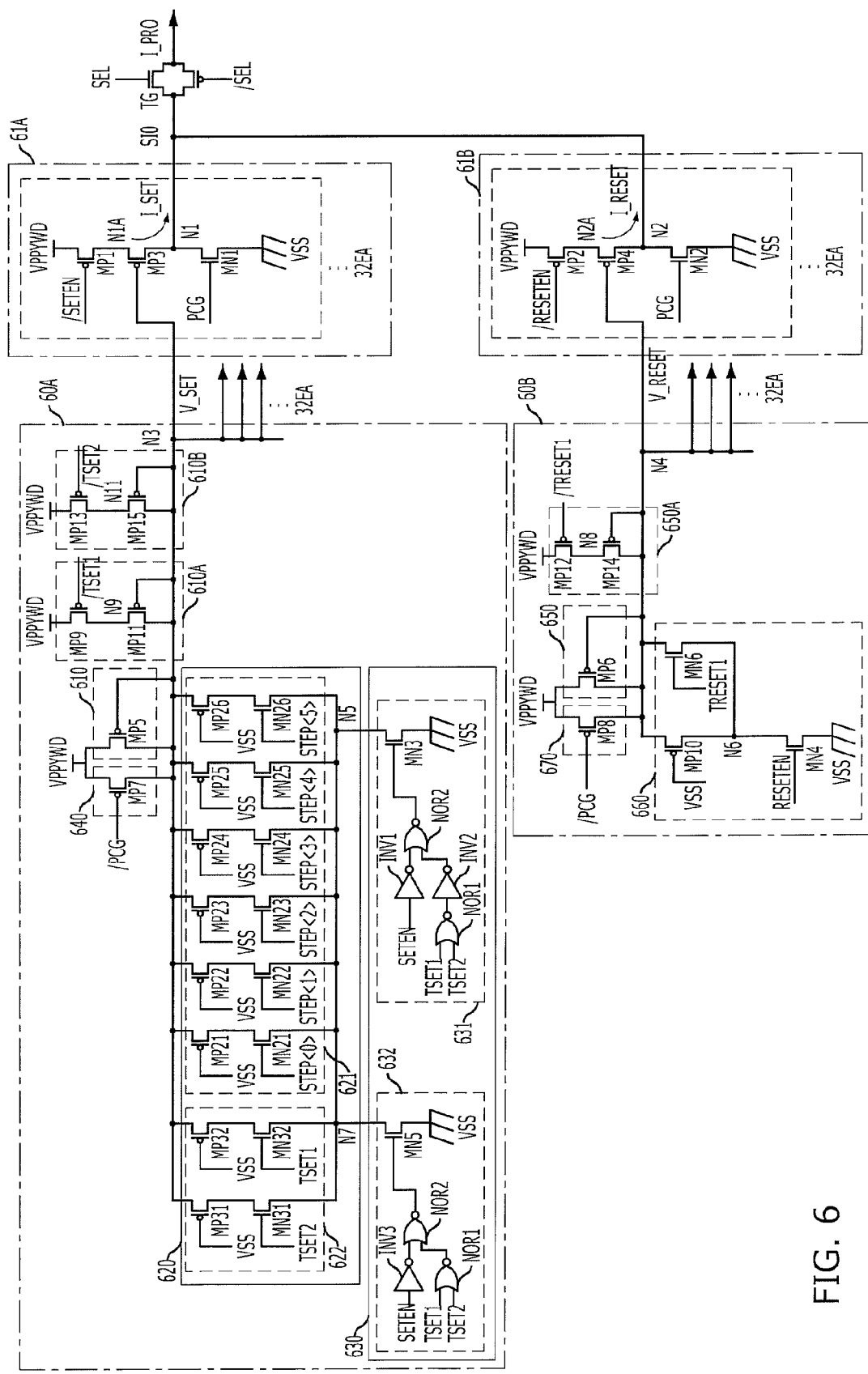
FIG. 6 illustrates a schematic circuit diagram of a phase change memory device in accordance with a third embodiment of the present invention.

FIG. 6 illustrates a constructive view of a phase change memory device in accordance with a third embodiment of the present invention.

Referring to FIG. 6, the phase change memory device includes a plurality of programming current driving blocks 61A•61B, each of which provides a corresponding phase change memory cell with a programming current I_PRO corresponding to input data, and a programming current adjusting block 60A•60B that is commonly connected to the plurality of programming current driving blocks 61A-61B and generates control voltages V_SET and V_RESET to adjust the programming current I_PRO.

The plurality of programming current driving blocks 61A-61B consists of total 32 blocks and provides the corresponding phase change memory cells with the programming current I_PRO under the control of one programming current adjusting block 60A•60B. In accordance with this embodiment, the programming current I_PRO may be transmitted to a selected phase change memory cell through a transmission gate TG controlled by selection signals SEL and /SEL.

The programming current adjusting block 60A•60B adjusts voltage levels of the control voltages V_SET and V_RESET corresponding to the input data to be programmed. The voltage levels of the first control voltage V_SET and the second control voltage V_RESET are adjusted to predetermined voltage levels according to a logic level of the input data. The plurality of programming current driving blocks 61A•61B outputs a set programming current I_SET or a reset programming current I_RESET as the programming current I_PRO, wherein the set programming current I_SET and the reset programming current I_RESET correspond to the voltage levels of the first control voltage V_SET and the second control voltage V_RESET, respectively.

A detailed construction and main operations of the phase change memory device illustrated in FIG. 6 will be described hereafter.

For the reference, since basic operations of the third embodiment illustrated in FIG. 6 are the same as those of the second embodiment illustrated in FIG. 5, overlapping explanation depicted above will be omitted and construction and operations relating to only the third embodiment will be described hereafter.

The programming current adjusting block 60A•60B includes a first programming current adjusting sector 60A and a second programming current adjusting sector 60B. The first programming current adjusting sector 60A is supplied with a first operating current in response to a first write control signal SETEN and further a second operating current or a third operating current in response to a first set control signal /TSET1 and a second set control signal /TSET2, thereby outputting a first bias signal V_SET, i.e., the first control voltage V_SET, having a voltage level corresponding to write control codes STEP<0:5>, TSET1 and TSET2. The second programming current adjusting sector 60B is supplied with a fourth operating current in response to a second write control signal RESETEN and further a fifth operating current in response to a first reset control signal /TRESET1, thereby outputting a second bias signal V_RESET, i.e., the second control voltage V_RESET, having a predetermined voltage level.

Herein, the first and second write control signals SETEN and RESETEN are generated in response to the input data to be programmed, and the first write control signal SETEN or the second write control signal RESETEN is enabled according to a logic level of the input data. Meanwhile, the first and second set control signals /TSET1 and /TSET2 and the first reset control signal /TRESET1 are generated in a test mode and controlled to additionally provide an operating current. That is, the above phase change memory device additionally provides the operating current in the test mode in the same manner as in the second embodiment illustrated in FIG. 5 to adjust initial absolute values of the set programming current I_SET and the reset programming current I_RESET. The difference between the third embodiment and the second embodiment is that the third embodiment employs two current driving units 610A and 610B to provide the first programming current adjusting sector 60A with an additional operating current and can selectively activate the current driving units 610A and 610B in the test mode. At this time, the two current driving units 610A and 610B each are preferably designed to have a different current drivability.

In accordance with the above embodiments of the present invention, since the phase change memory device generates the set programming current and the reset programming current in various manners and provides them to phase change memory cells, it is possible to improve the programming performance of the phase change memory cell. Furthermore, it is possible to substantially reduce a whole area occupied by the programming current adjusting block by controlling the plurality of programming current driving blocks using one programming current adjusting block.

While the present invention has been described with respect to the specific embodiments, it will be apparent to those skilled in the art that various changes and modifications may be made without departing from the spirit and scope of the invention as defined in the following claims.

For instance, the configuration of an active high logic level or active low logic level for representing an activation state of a signal and a circuit may be changed according to an embodiment of the present invention. Furthermore, the construction of transistors may be changed according to needs to implement the same function. The construction of a PMOS transistor and an NMOS transistor is exchangeable and various transistors can be used according to needs. The construction of a logic gate is also changeable according to needs to implement the same function. That is, a logic circuit such as a negative logical product unit and a negative logical sum unit may be constructed with various combinations of a NAND gate, a NOR gate, an inverter and so on. Moreover, it is possible to adjust a programming current through a test mode and to change the setting of the programming current using a fuse circuit based on the programming current adjusting result. Since the change of the circuit can be performed in various manners and the circuit change is apparent to those skilled in the art, the listing for the manners of changing the circuit is omitted.

What is claimed is:

1. A phase change memory device, comprising:
a plurality of programming current driving blocks each of which is configured to provide a corresponding phase change memory cell with a programming current corresponding to input data; and
a programming current adjusting block commonly connected to the plurality of programming current driving blocks and configured to generate a control voltage to adjust the programming current,
wherein the programming current adjusting block comprises:
a first programming current adjusting sector configured to output a first bias signal having a voltage level variable according to write control codes, in response to a first write control signal; and
a second programming current adjusting sector configured to output a second bias signal having a predetermined voltage level in response to a second write control signal.

2. The phase change memory device of claim 1, wherein the first and second write control signals are generated corresponding to the input data.

3. The phase change memory device of claim 2, wherein the first programming current adjusting sector comprises:
a current driving unit configured to provide an output node with an operating current during an activation period of the first write control signal;
a variable resistance unit connected to the output node and configured to be controlled by the write control codes; and
a pull-down driving unit connected to the variable resistance unit and configured to be activated in response to the first write control signal.

4. The phase change memory device of claim 3, wherein the first programming current adjusting sector further comprises a precharging unit configured to precharge the output node in response to a precharge signal.

5. The phase change memory device of claim 4, wherein the precharging unit comprises a precharge transistor that is connected between a supply voltage terminal and the output node and is configured to be controlled by the precharge signal.

6. The phase change memory device of claim 3, wherein the current driving unit comprises a transistor that is connected between a supply voltage terminal and the output node and has a gate node connected to the output node.

7. The phase change memory device of claim 3, wherein the variable resistance unit comprises a plurality of transistor groups that are connected in parallel with each other and configured to be controlled by the write control codes and a ground voltage.

8. The phase change memory device of claim 7, wherein each of the plurality of transistor groups comprises:
a first transistor configured to be controlled by the ground voltage; and
a second transistor connected to the first transistor and configured to be controlled by a corresponding one of the write control codes.

9. The phase change memory device of claim 3, wherein the pull-down driving unit comprises a pull-down transistor connected between the variable resistance unit and a ground voltage terminal and configured to be controlled by the first write control signal.

10. The phase change memory device of claim 2, wherein the second programming current adjusting sector comprises:

a current driving unit configured to provide an output node with an operating current during an activation period of the second write control signal; and a pull-down driving unit connected to the output node and configured to be activated in response to the second write control signal.

11. The phase change memory device of claim 10, wherein the second programming current adjusting sector further comprises a precharging unit configured to precharge the output node in response to a precharge signal.

12. The phase change memory device of claim 11, wherein the precharging unit comprises a precharge transistor that is connected between a supply voltage terminal and the output node and configured to be controlled by the precharge signal.

13. The phase change memory device of claim 10, wherein the current driving unit comprises a transistor that is connected between a supply voltage terminal and the output node and has a gate node connected to the output node.

14. The phase change memory device of claim 10, wherein the pull-down driving unit comprises:
a first transistor connected between the output node and a first node and configured to be controlled by a ground voltage; and
a pull-down transistor connected between the first node and a ground voltage terminal and configured to be controlled by the second write control signal.

15. A phase change memory device, comprising:
a plurality of programming current driving blocks each of which is configured to provide a corresponding phase change memory cell with a programming current corresponding to input data; and
a programming current adjusting block commonly connected to the plurality of programming current driving blocks and configured to generate a control voltage to adjust the programming current,
wherein the programming current adjusting block comprises:
a first programming current adjusting sector configured to be supplied with a first operating current in response to a first write control signal and additionally supplied with a second operating current in response to a first control signal, thereby outputting a first bias signal having a voltage level variable according to write control codes; and
a second programming current adjusting sector configured to be supplied with a third operating current in response to a second write control signal and additionally supplied with a fourth operating current in response to a second control signal, thereby outputting a second bias signal having a predetermined voltage level, wherein the first and second write control signals are generated corresponding to the input data.

16. The phase change memory device of claim 15, wherein the first and second control signals are generated in a test mode.

17. The phase change memory device of claim 15, wherein the first programming current adjusting sector comprises:
a first current driving unit configured to provide an output node with the first operating current during an activation period of the first write control signal;
a second current driving unit configured to provide the output node with the second operating current in response to the first control signal during the activation period of the first write control signal;
a variable resistance unit connected to the output node and configured to be controlled by the write control codes; and
a pull-down driving unit connected to the variable resistance unit and configured to be activated in response to the first write control signal and the first control signal.

18. The phase change memory device of claim 17, wherein the first programming current adjusting sector further comprises a precharging unit configured to precharge the output node in response to a precharge signal.

19. The phase change memory device of claim 18, wherein the precharging unit comprises a precharge transistor that is connected between a supply voltage terminal and the output node and configured to be controlled by the precharge signal.

20. The phase change memory device of claim 17, wherein the first current driving unit comprises a first transistor that is connected between a supply voltage terminal and the output node and has a gate node connected to the output node.

21. The phase change memory device of claim 20, wherein the second current driving unit comprises:
a second transistor connected between the supply voltage terminal and a first node and configured to be controlled by the first control signal; and
a third transistor that is connected between the first node and the output node and has a gate node connected to the output node.

22. The phase change memory device of claim 17, wherein the variable resistance unit comprises:
a plurality of first transistor groups that are connected in parallel with each other and configured to be controlled by first write control codes and a ground voltage; and
a plurality of second transistor groups that are connected in parallel with each other and configured to be controlled by second write control codes and the ground voltage.

23. The phase change memory device of claim 22, wherein each of the plurality of first transistor groups comprises:
a first transistor configured to be controlled by the ground voltage; and
a second transistor connected to the first transistor and configured to be controlled by a corresponding one of the first write control codes.

24. The phase change memory device of claim 22, wherein each of the plurality of second transistor groups comprises:
a first transistor configured to be controlled by the ground voltage; and
a second transistor connected to the first transistor and configured to be controlled by a corresponding one of the second write control codes.

25. The phase change memory device of claim 17, wherein the pull-down driving unit comprises a plurality of transistors that is connected between the variable resistance unit and a ground voltage terminal and configured to respond to the first write control signal and the first control signal.

26. The phase change memory device of claim 22, wherein the pull-down driving unit comprises:
a first inverter configured to receive the first write control signal;
a first logic gate configured to receive an output signal of the first inverter and the first control signal;
a first pull-down transistor connected between the plurality of first transistor groups and a ground voltage terminal and configured to be controlled by an output signal of the first logic gate;
a second inverter configured to receive the first write control signal;
a third inverter configured to receive the first control signal;
a second logic gate configured to receive output signals of the second and the third inverters; and
a second pull-down transistor connected between the plurality of second transistor groups and the ground voltage terminal and configured to be controlled by an output signal of the second logic gate.

27. The phase change memory device of claim 15, wherein the second programming current adjusting sector comprises:
a first current driving unit configured to provide an output node with the third operating current during an activation period of the second write control signal;
a second current driving unit configured to provide the output node with the fourth operating current in response to the second control signal during the activation period of the second write control signal; and
a pull-down driving unit connected to the output node and configured to be activated in response to the second write control signal and the second control signal.

28. The phase change memory device of claim 27, wherein the second programming current adjusting sector further comprises a precharging unit configured to precharge the output node in response to a precharge signal.

29. The phase change memory device of claim 28, wherein the precharging unit comprises a precharge transistor that is connected between a supply voltage terminal and the output node and configured to be controlled by the precharge signal.

30. The phase change memory device of claim 27, wherein the first current driving unit comprises a first transistor that is connected between a supply voltage terminal and the output node and has a gate node connected to the output node.

31. The phase change memory device of claim 30, wherein the second current driving unit comprises:
a second transistor connected between the supply voltage terminal and a first node and configured to be controlled by the second control signal; and
a third transistor that is connected between the first node and the output node and has a gate node connected to the output node.

32. The phase change memory device of claim 27, wherein the pull-down driving unit comprises a plurality of transistors connected between the output node and a ground voltage terminal and configured to respond to the second write control signal and the second control signal.

33. The phase change memory device of claim 27, wherein the pull-down driving unit comprises:
a first transistor connected between the output node and a first node and configured to be controlled by a ground voltage;
a second transistor connected between the output node and the first node and configured to be controlled by the second control signal; and
a pull-down transistor connected between the first node and a ground voltage terminal and configured to be controlled by the second write control signal.

34. The phase change memory device of claim 15, wherein the plurality of programming current driving blocks comprises:
a plurality of first programming current driving sectors each of which is configured to provide a corresponding phase change memory cell with a programming current corresponding to the voltage level of the first bias signal; and
a plurality of second programming current driving sectors each of which is configured to provide the corresponding phase change memory cell with a programming current corresponding to the voltage level of the second bias signal.

35. The phase change memory device of claim 34, wherein each of the plurality of first programming current driving sectors comprises:

a first transistor connected between a supply voltage terminal and a first node and configured to be controlled by the first write control signal; and
a second transistor connected between the first node and an output node and configured to be controlled by the first bias signal.

36. The phase change memory device of claim 35, wherein each of the plurality of first programming current driving sectors further comprises a precharge transistor that is connected between the output node and a ground voltage terminal and is configured to be controlled by a precharge signal.

37. The phase change memory device of claim 34, wherein each of the plurality of second programming current driving sectors comprises:
a first transistor connected between a supply voltage terminal and a first node and configured to be controlled by the second write control signal; and
a second transistor connected between the first node and an output node and configured to be controlled by the second bias signal.

38. The phase change memory device of claim 37, wherein each of the plurality of second programming current driving sectors further comprises a precharge transistor that is connected between the output node and a ground voltage terminal and is configured to be controlled by a precharge signal.

39. A phase change memory device for providing a phase change memory cell with a programming current through the control of first and second control voltages corresponding to input data, the phase change memory device comprising:
a first common programming current adjusting sector including a first current driving unit for receiving a supply voltage and configured to provide a first operating current, thereby generating the first control voltage having a voltage level variable according to write control codes, in response to a first write control signal;
a second common programming current adjusting sector including a second current driving unit for receiving the supply voltage and configured to provide a second operating current, thereby generating the second control voltage having a predetermined voltage level in response to a second write control signal;
a plurality of first programming current driving sectors each of which is configured to supply a corresponding phase change memory cell with a programming current corresponding to the first control voltage; and
a plurality of second programming current driving sectors each of which is configured to supply the corresponding phase change memory cell with a programming current corresponding to the second control voltage.

40. The phase change memory device of claim 39, wherein the first common programming current adjusting sector comprises:
the first current driving unit configured to supply an output node of the first control voltage with the first operating current during an activation period of the first write control signal;
a variable resistance unit connected to the output node of the first control voltage and configured to be controlled by the write control codes; and
a pull-down driving unit connected to the variable resistance unit and configured to be activated in response to the first write control signal.

41. The phase change memory device of claim 40, wherein the first common programming current adjusting sector further comprises a precharging unit configured to precharge the output node of the first control voltage in response to a precharge signal.

42. The phase change memory device of claim 41, wherein the precharging unit comprises a precharge transistor that is connected between a supply voltage terminal and the output node of the first control voltage and is configured to be controlled by the precharge signal.

43. The phase change memory device of claim 40, wherein the first current driving unit comprises a transistor that is connected between a supply voltage terminal and the output node of the first control voltage and has a gate node connected to the output node of the first control voltage.

44. The phase change memory device of claim 40, wherein the variable resistance unit comprises a plurality of transistor groups connected in parallel with each other and controlled by the write control codes and a ground voltage.

45. The phase change memory device of claim 44, wherein each of the plurality of transistor groups comprises:
a first transistor configured to be controlled by the ground voltage; and
a second transistor connected to the first transistor and configured to be controlled by a corresponding one of the write control codes.

46. The phase change memory device of claim 40, wherein the pull-down driving unit comprises a pull-down transistor connected between the variable resistance unit and a ground voltage terminal and configured to be controlled by the first write control signal.

47. The phase change memory device of claim 39, wherein the second common programming current adjusting sector comprises:
the second current driving unit configured to provide an output node of the second control voltage with the second operating current during an activation period of the second write control signal; and
a pull-down driving unit connected to the output node of the second control voltage and configured to be activated in response to the second write control signal.

48. The phase change memory device of claim 47, wherein the second common programming current adjusting sector further comprises a precharging unit configured to precharge the output node of the second control voltage in response to a precharge signal.

49. The phase change memory device of claim 48, wherein the precharging unit comprises a precharge transistor that is connected between a supply voltage terminal and the output node of the second control voltage and is configured to be controlled by the precharge signal.

50. The phase change memory device of claim 47, wherein the second current driving unit comprises a transistor that is connected between a supply voltage terminal and the output node of the second control voltage and has a gate node connected to the output node of the second control voltage.

51. The phase change memory device of claim 47, wherein the pull-down driving unit comprises:
a first transistor connected between the output node of the second control voltage and a first node and configured to be controlled by a ground voltage; and
a pull-down transistor connected between the first node and a ground voltage terminal and controlled by the second write control signal.

52. The phase change memory device of claim 39, wherein each of the plurality of first programming current driving sectors comprises:
a first transistor connected between a supply voltage terminal and a first node and configured to be controlled by the first write control signal; and
a second transistor connected between the first node and an output node and configured to be controlled by the first control voltage.

53. The phase change memory device of claim 52, wherein each of the plurality of first programming current driving sectors further comprises a precharge transistor that is connected between the output node and a ground voltage terminal and configured to be controlled by a precharge signal.

54. The phase change memory device of claim 39, wherein each of the plurality of second programming current driving sectors comprises:
a first transistor connected between a supply voltage terminal and a first node and configured to be controlled by the second write control signal; and
a second transistor connected between the first node and an output node and configured to be controlled by the second control voltage.

55. The phase change memory device of claim 54, wherein each of the plurality of second programming current driving sectors further comprises a precharge transistor that is connected between the output node and a ground voltage terminal and is configured to be controlled by a precharge signal.

56. A phase change memory device, comprising:
a plurality of phase change memory cells;
a plurality of programming current driving blocks, each of which is configured to provide a programming current corresponding to input data;
a programming current adjusting block commonly connected to the plurality of programming current driving blocks and configured to generate a control voltage to adjust the programming current; and
a plurality of transmission blocks, each of which is coupled between a corresponding one of the programming current driving blocks and a corresponding one of the phase change memory cells, and is configured to transmit the programming current to the corresponding phase change memory in response to a control signal.

* * * * *